United States Patent [19]

Cho

[11] Patent Number: 5,025,421
[45] Date of Patent: Jun. 18, 1991

[54] SINGLE PORT DUAL RAM

[76] Inventor: Gyung Y. Cho, Dong-A Apt. 25-1403, Bupyung 1-Dong, Buk-Ku, Inchon, Rep. of Korea

[21] Appl. No.: 459,887

[22] Filed: Jan. 2, 1990

[30] Foreign Application Priority Data

Jan. 9, 1989 [KR] Rep. of Korea ............... 89175

[51] Int. Cl.$^5$ .............................................. G11C 13/00
[52] U.S. Cl. ............................... 365/230.05; 365/228; 365/189.04
[58] Field of Search ............. 365/78, 228, 189.04, 365/230.05

[56] References Cited

U.S. PATENT DOCUMENTS 4,584,663  4/1986  Tanikawa ........................ 365/228

Primary Examiner—Terrell W. Fears

[57] ABSTRACT

A single port dual RAM comprising, on a single chip, at least one storage array including a plurality of hierarchical bit lines which serve as the interconnecting path between dynamic type storage elements for main memory and static type storage elements for cache memory. Each of said storage array(s) includes an input/output port for selective access to the storage array. Each hierarchical bit line includes a DRAM bit line, a SRAM bit line and interface means for electrically interconnecting the DRAM bit line to the SRAM bit line or isolating the DRAM bit line from the SRAM bit line. A SPDRAM chip which shares typical DRAM peripheral circuitry may be employed in a distributed on-chip cache to enlarge the data transfer width in a simple structure.

9 Claims, 4 Drawing Sheets

SINGLE PORT DUAL RAM

FIELD OF THE INVENTION

The present invention relates to a semiconductor memory device; and, more particularly, to a single port dual RAM(SPDRAM) capable of providing a distributed, on-chip cache in small computer systems. The SPDRAM comprises, on a single chip, one or more than one storage array including a plurality of hierarchical bit lines which serve to interconnect dynamic type storage elements for main memory and static type storage elements for cache memory; shares a single I/O port for accessing the hierachical bit lines and typical peripheral circuit of DRAM; and provides a distributed, on-chip cache without any limitation on the data transfer width Each of the hierarchical bit line comprises a DRAM bit line, a SRAM bit line and interface means for electrically interconnecting the DRAM bit line to the SRAM bit line or isolating the DRAM bit line from the SRAM bit line.

BACKGROUND OF THE INVENTION

The use of a cache for performance improvements on large and small computer systems is well known. In such systems, the principal factors determining the cache efficiency are the mapping method, cache size and line size, etc. The relationship between these factors and the efficiency is described in various papers, e. g., *IEEE Transaction on Computer,* "Line(Block) Choice for CPU Cache Memories", by Alan Jay Smith, September 1987, pp 1063-1075; and *IEEE Computer,* "Cache Based Computer System," by R. R. Kaplan, et al., March 1973, pp 30-33.

Among the principal factors, the line size has an important effect on the miss ratio of a cache. Increasing the line size decreases the miss ratio of a cache; and the miss ratio reaches its minimum at the optimum line size. That is, increasing the line size beyond the optimum value again increases the miss ratio.

Even at the optimum line size, the cache efficiency is further affected by the data transfer width between the SRAM chips employed in the cache and the DRAM chips constituting the main memory. That is, should the data transfer width be too small, the time to load the cache with a data block taken from the main memory will be longer, thereby lowering the cache efficiency.

In large computing systems, various techniques known in the art may be used to enlarge the data transfer width. However, in a small system wherein cache is a separate physical entity made of only a few high speed array chips, the bus width between the cache and the main memory is severely limited by the small signal pin count available on the cache chips.

In order to overcome this problem in small systems, U.S. Pat. No 4,577,293 issued to Richard E. Matick, et al. discloses a distributed, on-chip cache which has a large band width between the main memory array and an on-chip row buffer to provide a fast reload time on a cache miss wherein the distributed cache is achieved by the use of a communicating random access memory chip of the type incorporating a primary port and a secondary port.

The communicating random access memory chip is described in U.S. Pat. No. 4,649,516 issued to Paul W. Chung, et al.

The use of another memory device is disclosed in *Symphosium on VLSI Circuit Digest of Technical Papers,* "AN EXPERIMENTAL IMb CACHE DRAM WITH ECC", by Mikio Asakuro et al. pp 43-44 (May, 1989). This memory device comprises SRAM and DRAM integrated on a chip, wherein the SRAM and DRAM share internal data bus but have separate corresponding peripheral circuits.

SUMMARY OF THE INVENTION

It is an object of the present invention to provide a single port dual RAM which allows a large data transfer width between the cache and the main memory by way of operating, on the same bit line, the SRAM cell arrays and the DRAM cell arrays which are included in the main memory.

It is another object of the present invention to provide a single port dual RAM for cache memory, which contains one I/O port to the memory array and shares typical DRAM peripheral circuit, thereby greatly enhancing the data path in a simple structure.

It is a further objective of the present invention to provide a single port dual RAM, capable of increasing the cache capacity according to the main memory size, regardless of the data transfer width.

It is a still another objective of the present invention to provide a distributed on-chip cache employed in small computing systems, which comprises a plurality of single port dual RAMs and is capable of providing an optimum cache efficiency.

In accordance with the invention, the single port dual RAM comprises at least one storage array. The storage array includes a plurality of bit lines and an I/O port connected to said plurality of bit lines by gate means for access to the storage array.

Each bit line comprises at least one DRAM bit line employed in a DRAM storage array, one SRAM bit line employed in a SRAM storage array and interface means. The DRAM bit line is a typical one having a plurality of dynamic type storage elements, a sense amplifier and the like. The SRAM bit line which provides the distributed cache includes at least one static type storage element.

The interface means electrically interconnects one of the DRAM bit lines to the SRAM bit line or isolates the DRAM bit lines from the SRAM bit line.

A distributed on-chip cache is constructed of a plurality of single port dual RAMs.

BRIEF DESCRIPTION OF THE DRAWINGS

The foregoing and other aspects and advantages of the invention may be better understood with reference to the following drawings.

DETAILED DESCRIPTION

Figure 1:
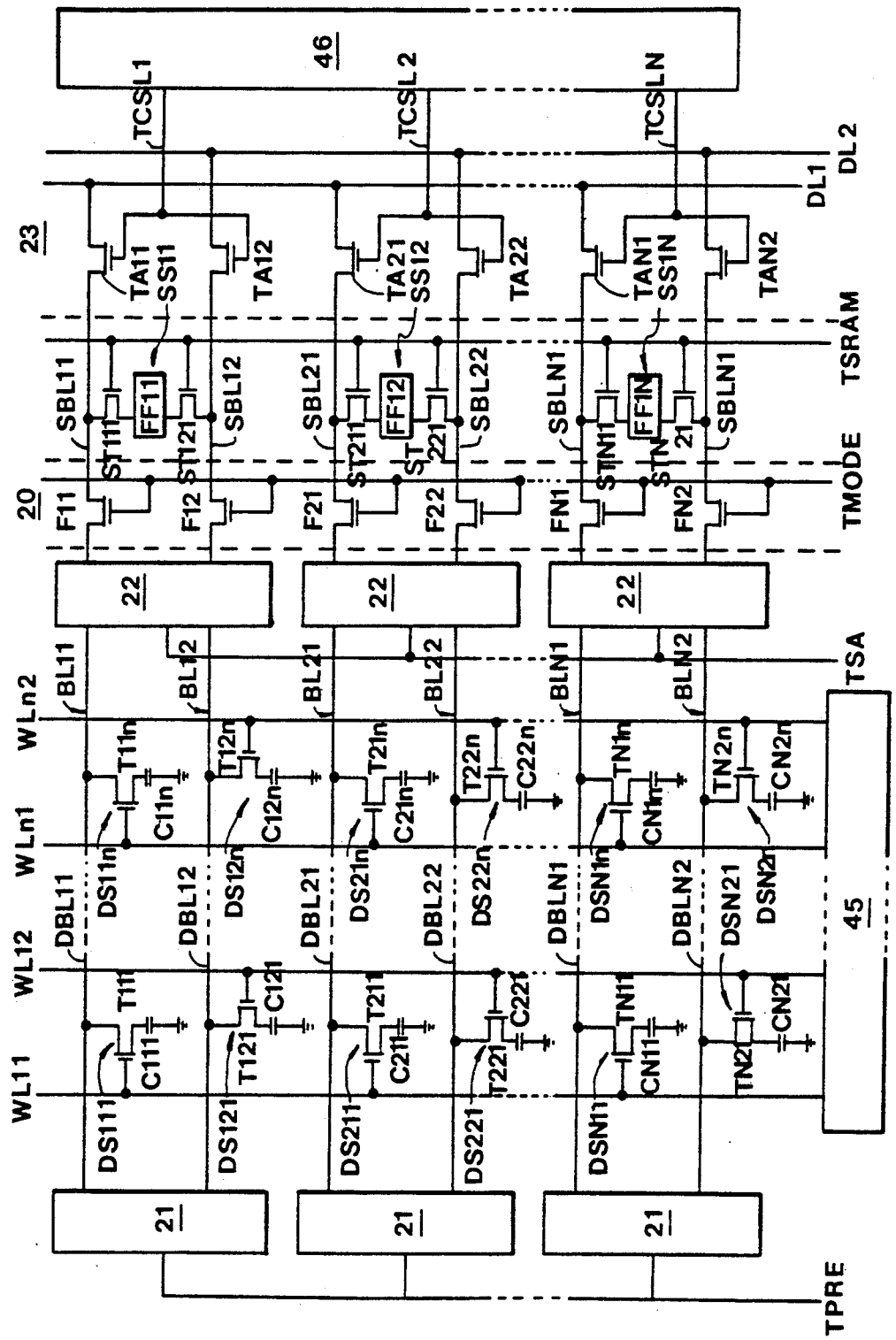
FIG. 1 is a detailed diagram of the storage array of SPDRAM according to the present invention.

FIG. 1 is a schematic diagram of the storage array of SPDRAM in accordance with the present invention. With reference to FIG. 1, the storage array of SPDRAM comprises a plurality of hierarchical bit lines denoted as BL11 to BLN2 wherein the first numerical subscript, e.g., 1,2,..., or N, denotes the hierarchical bit line number and the second numerical subscript, i. e., 1 or 2, denotes whether it is hierarchical bit line 1 or its complementary bit line 2. For example, BL12 identifies the complementary bit line of the first hierarchical bit line.

Each hierarchical bit line BL is divided into two different parts. The first part is a DRAM bit line DBL including a plurality of DRAM storage cells DS. Each of the storage elements DS comprises storage capacitor means C and a corresponding MOS transistor T linking said storage capacitor means C to its corresponding DRAM bit line DBL.

The storage capacitor means C may be a conventional DRAM storage element which is well known in the art.

All the storage capacitors associated with the DRAM bit line DBL11 of the first hierarchical bit line have the common designation C11 followed by a numerical subscript from 1 to n.

Similarly, the storage capacitors associated with the DRAM bit line DBL12 of the complementary bit line of the first hierarchical bit line bear the common designation C12 followed by a numerical subscript from 1 to n.

In a similar manner, all MOS transistors forming the first part of the storage elements associated with the DRAM bit line DBL11 of the first hierarchical bit line have the common designation T11 followed by a numerical subscript from 1 to n; and, for the DRAM bit line DBL12, the common designation T12 followed by a numerical subscript from 1 to n.

Each DRAM bit line DBL also includes a sense amplifier 22 for sensing the voltage level of each DRAM bit line DBL and amplifying the voltage to a predetermined level, for example, "1" or "0" in binary state; and a typical precharge circuit 21 for applying a reference voltage to each DRAM bit line.

The second part of the hierarchical bit line is a SRAM bit line comprising one SRAM storage element SS. Each SRAM storage element SS comprises storage flip flop means FF and a pair of corresponding MOS transistors ST linking said storage flip flop means FF to its corresponding SRAM bit lines SBLy1 and SBLy2, respectively, where y is the SRAM bit line number which ranges from 1 to N.

Accordingly, for example, a flip flop FF11 associated with the SRAM bit line SBL11 of the first hierarchical bit line is connected to the SRAM bit line SBL11 and its complementary SRAM bit line SBL12, via MOS transistors ST111 and ST121.

The MOS transistors ST are turned simultaneously ON and OFF by the signal TSRAM of the control line connected to the gate of the MOS transistors. The first and the second parts of the hierarchical bit line are connected by interface means 20 comprising a plurality of MOS transistors F having drain and source connected to DRAM bit lines DBL and SRAM bit line SBL, and the gate connected to the control line.

As shown in FIG. 1, the DRAM storage matrix is divided into columns and rows. The selection of any particular storage element DS in this matrix is initiated by a signal from the word line selection means 45, which has a plurality of word selection lines WL.

Each of the word selection lines WL is connected to the gate electrode of the MOS transistors in the storage element DS in a row of DRAM storage elements. The word selection line WL11, for example, is connected to the gate electrode of transistors T111,T211,... to TN11; and the word selection line WL12 is connected to the gate electrodes of transistor T121, T221,... to TN21.

Alternatively, all hierarchical bit lines are connected to an I/O port 23 for data access. The I/O port 23 comprises a plurality of MOS access transistors TA, I/O data buses DL and bit selection means 46. The I/O data buses DL comprising I/O data bus DL1 and complementary I/O data bus DL2 are in turn respectively connected, through the first TAy1 and the second TAy2 MOS access transistors, to the hierarchical bit lines BLy1 and BLy2, where y denotes the bit line number which ranges from 1 to N.

Since the gate electrode of TAy1 and TAy2 MOS access transistors associated with each hierarchical bit line is connected, via the bit selection line, to the bit selection means 46, TAy1 and TAy2 MOS access transistors of each hierarchical bit line are turned ON or OFF as required by a signal TCSLy from the bit selection means 46.

In view of the foregoing description, each DRAM and SRAM storage element may be of a typical memory element respectively and may have a variety of configurations. The sense amplifier 22 and the precharge circuit 21 depicted in FIG. 1 may be of a conventional DRAM circuit and take various forms in the configuration or structure.

It will be understood that the DRAM bit line may additionally comprise one or more dummy storage element(not depicted in the drawings) for the stable operation of the sense amplifier 22.

In accordance with this invention, the SRAM bit lines SBL are considerably shorter than the DRAM bit lines. Thus, when the DRAM bit lines DBL are electrically connected to the SRAM bit lines SBL by the interface means 20, capacitance and line resistance of the SRAM bit lines SBL can be disregarded.

Preferably, the size of the MOS transistor in the SRAM storage element SS is smaller than that of the MOS transistor in the DRAM sense amplifier 22.

The DRAM bit line DBL is connected to or isolated from the SRAM bit line SBL by interface means 20 to form a common hierarchical bit line. Accordingly, various operations and embodiments of the present invention will be explained based on the hierarchical bit line.

1] Storing the SRAM storage element SS11 with the data from the DRAM storage element DS111; and transmitting it to the I/O data line DL1

Before commencing this operation, the DRAM bit line DBL11 is precharged to the reference voltage; and is isolated from the SRAM bit line SBL11 by the switching transistor F11 of the interface means 20.

Then, the control signal TPRE having the state of "1" is applied to the precharge circuit 21 in order to interrupt the precharging operation.

If the MOS transistor T111 of the DRAM storage element DS111 is turned ON by the word selection line WL11 at "1", the charge stored in the storage capacitor C111 of the DRAM storage element DS111 is conducted into the DRAM bit line DBL11.

A slight voltage variation occurs on the DRAM bit line DBL11 because the capacitance of DRAM bit line DBL11 is several times larger than that of the storage capacitor C111; and there will be a time delay for the voltage variation to reach the sense amplifier 22 due to the large length of the DRAM bit line.

When the sense amplifier control signal TSA is in the state of "1", the source voltage(not shown in the drawings) is applied to the sense amplifier 22 so as to amplify the weak voltage variation of the DRAM bit line DBL.

When this voltage variation is amplified to a predetermined level, the interface control signal TMODE and the SRAM storage control signal TSRAM will be made to be at the state of "1" so as to turn ON the MOS transistor F11 and the MOS transistors ST111 and ST121 of the SRAM storage element SS11. Consequently, the SRAM storage element SS11 becomes connected to the DRAM bit line DBL11; and the data of the DRAM bit line DBL11 will be stored at the flip flop FF11 in the SRAM storage element SS11 because the size of the MOS transistor in the sense amplifier 22 is larger than that of the MOS transistor of the SRAM storage element SS11.

On the other hand, if the bit selection signal TCSL1 from the bit selection means 46 is in the state of "1", the data of the SRAM bit line SBL11 is retrieved via the MOS transistor TA11 of the I/O port 23 onto the data line DL1.

As explained above, the data stored in a group of DRAM storage elements, as selected by the signal from the word line selection means 45 can be simultaneously stored into the row of the SRAM storage elements; and a given bit line can be accessed by the bit selection means 46.

Upon the completion of the retrieval operation, the signal TMODE and the signal TSRAM become "0" so that the flip flop FF11 of the SRAM storage element SS11 becomes isolated from the SRAM bit line SBL11 and also that the SRAM bit line SBL11 becomes isolated from the DRAM bit line DBL11.

Next, the word selection line WL11 will have the state of "0" so that the data stored in the DRAM bit line DBL11 becomes restored into the DRAM storage element DS111. Further, the supply of the source voltage to the sense amplifier 22 becomes interrupted and discontinued by the signal TSA; and the DRAM bit line DBL11 is charged to the reference voltage by the precharge circuit 21. These steps, described above, are carried out, in the event of a cache miss, to retrieve the data on a word line unit basis from the DRAM storage elements DS, i. e., the main memory, and store the data in a row of the SRAM storage elements SS, i.e., cache.

On the other hand, the operations which serve to write the data from the I/O data line DL1 into the DRAM storage element DS111 and the SRAM storage element SS11 may be described as follows.

Generally, the transistors contained in the I/O data driver 57 of the I/O data line DL(shown in FIG. 2) are considerably larger in size than those in the sense amplifiers 22 of the DRAM bit lines DBL and the flip flops FF of the SRAM storage elements. Accordingly, if the signal TCSL1 is "1" and the I/O data driver 57 is activated, the data will be distributed to the DRAM bit line DBL11 and the SRAM bit line SBL11; and stored in each of these storage elements.

2] Amplifying the data of the DRAM storage element DS111; and transmitting it to the I/O data line DL1

Similar to the operation described in 1] above, while the signal TMODE, when it is "1", links the DRAM bit line DBL11 to the SRAM bit line SBL11, by way of maintaining the signal TSRAM at "0", the flip flop FF11 of the SRAM storage element gets separated from the SRAM bit line SBL11, thereby maintaining the SRAM storage element SS11 unchanged.

In this operation, the SRAM bit line SBL11 functions only as an electroconductive line connecting the DRAM bit line DB11 to the I/O data line DL1.

3] Storing in the DRAM storage element SS11 the data from the SRAM storage element DS111

When the signal TSRAM becomes "1", the data from the SRAM storage element SS11 is transferred to the SRAM bit line SBL11. Then, the signal TPRE interrupts to stop the precharging of the DRAM bit line; and the signal TMODE becomes "1". Subsequently, the MOS transistor F11 of the interface means 20 is turned ON to, thereby, electrically connect the DRAM bit line DBL11 to the SRAM bit line SBL11. As a result, the data of the SRAM bit line SBL11 becomes transferred to the capacitance of the DRAM bit line DBL11.

While the DRAM storage element DS111 is connected to the DRAM bit line DBL11 by the operation of the word selection line WL11, because the charge in the SRAM storage element SS11 is considerably greater than the charge previously stored in the DRAM storage element DS111, the DRAM bit line DBL11 will have the data from the SRAM storage element SS11.

Accordingly, the capacitance of the DRAM bit line DBL becomes a write-through buffer. Since the voltage of the SRAM storage element SS11 has been dropped by the MOS transistor ST111 of the SRAM storage element SS11 and the MOS transistor F11 of the interface means 20, it is amplified to a predetermined level by the sense amplifier 22 and stored in the DRAM storage element DS111. This operation is called a write-back on cache.

Since the data from the SRAM storage elements SS is temporarily stored in the capacitance of the DRAM bit lines DBL, it is possible to maintain the data of the SRAM storage elements SS distributed between the DRAM bit lines DBL and the SRAM bit lines SBL, respectively, by the interface means 20. Accordingly, while storing the data in the DRAM storage elements, by way of independently keeping TCSL at "1", it is possible to read and write the data by connecting the SRAM bit line SBL11 to the I/O data line DL1.

4] Transmitting the data from the SRAM storage element SS11 to the I/O data line DL1

To carry out this operation, only the SRAM storage element SS11 is required. The SRAM bit line SBL11 is electrically isolated from the DRAM bit line SBL11 by turning OFF the MOS transistor F11 of the interface means 20.

According to this embodiment, a small number of SRAM storage elements, e. g., one or two, are connected to their corresponding SRAM bit lines.

Thus, the SRAM bit lines have smaller line resistance and capacitance than the case of a conventional SRAM; and, therefore, in the event of a cache hit, the SRAM can be activated in a higher speed.

5] Transmitting the data from the SRAM storage element SS11 to the I/O data line DL1; and refreshing the DRAM storage element DS111.

The hierarchical bit line BL11 is divided into the DRAM bit line DBL11 and the SRAM bit line SBL11 by the interface means 20. Therefore, while the SRAM storage element SS11 is operational, the DRAM storage elements DS111 can be independently refreshed, thereby minimizing the performance deterioration of the memory caused by the DRAM refresh.

While the above description is made with reference to the operation of one particular hierarchical bit line BL11, it can be easily understood that all of the hierarchical bit lines BL may be similarly operated.

Since the operation to amplify the data contained in the DRAM storage elements DS and store it in the SRAM storage elements SS and its reverse operation are conducted by the word line selection means 45 and the signal TSRAM on a word line unit basis, and the data transfer width between the DRAM and the SRAM is the same as the size of the word line.

Figure 3:
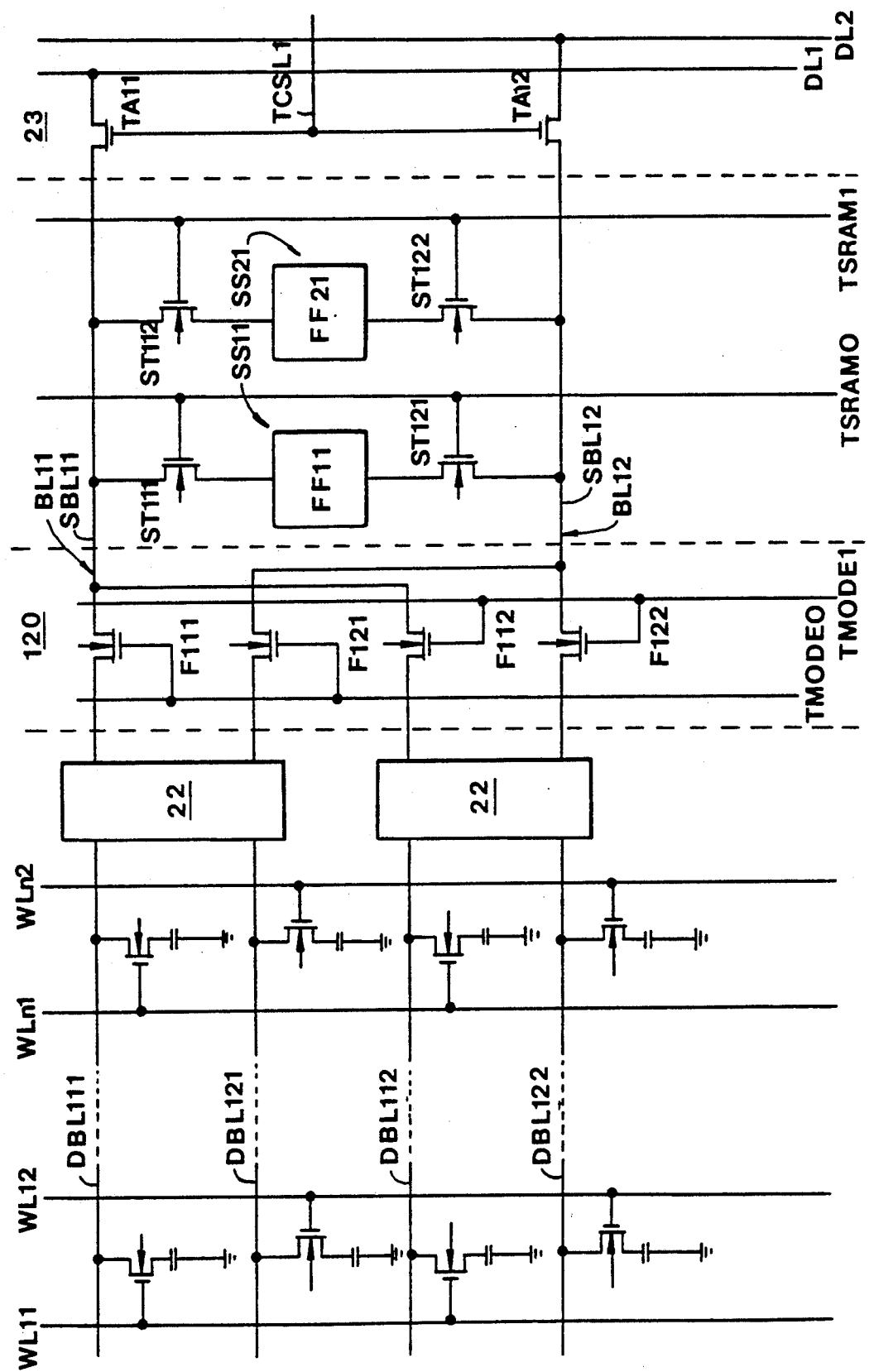
FIG. 3 is a detailed diagram of a portion of the storage array according to another embodiment of the invention.

While the illustration in FIG. 1 shows one SRAM storage element, e. g., SS11, connected to one corresponding SRAM bit line, e. g., SBL11, two SRAM storage elements, e. g., SS11 and SS21, shown in FIG. 3, may be connected to their corresponding SRAM bit line, e. g., SBL11, for a two-way set associative map of cache.

Figure 2:
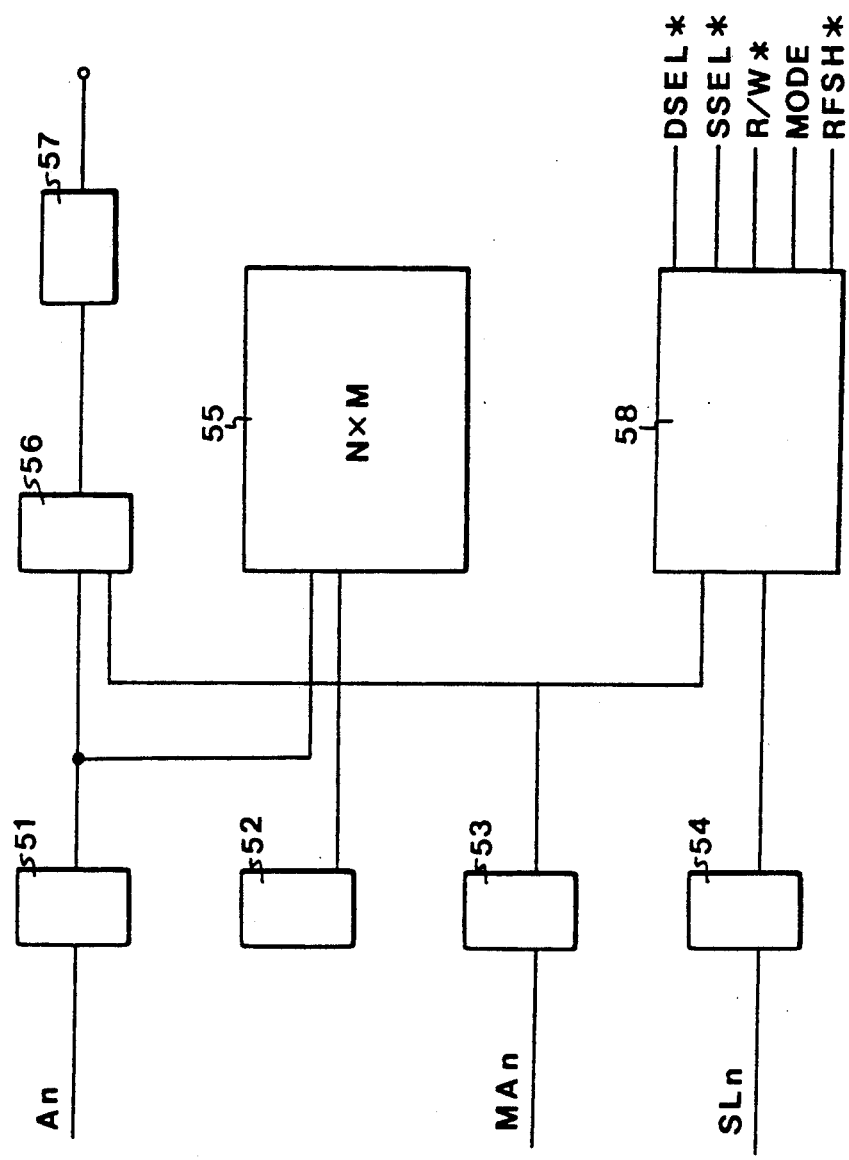
FIG. 2 is a schematic block diagram of SPDRAM comprising at least one storage array as shown in FIG. 1.

FIG. 2 depicts the schematic block diagram of SPDRAM comprising one or more storage array. The SPDRAM comprises: a memory block 55 which includes a plurality of storage arrays arranged in an N×M matrix; and typical addressing means such as a word line address latch 51 and a bit address latch 52 for designating the row and column address An to the bit selection means 46 and the word line selection means 45 of each storage array.

As the memory block 55 is constituted with a plurality of storage arrays arranged N×M and each storage array has at least one row of SRAM storage elements as the SRAM storage array, the SPDRAM further comprises: the storage array address latch 53 for selecting a particular storage array; the SRAM word line address latch 54 for selecting a particular row of the SRAM storage elements; a typical refresh counter 56 which generates a refresh address to refresh the matrix of DRAM storage elements; an I/O data driver 57 for transferring the data from the I/O data lines DL of each storage array to an external data bus; and the clock generator 58 which generates the control signals, DSEL*, SSEL*, R/W*, MODE and RFSH*, wherein the signal DSEL* operates the DRAM storage elements and the signal SSEL* does the SRAM storage elements.

The operating sequence of the DRAM and SRAM storage elements does not need to be fixed. Accordingly, if the DRAM storage elements are operated prior to the SRAM storage elements, the data contained in the DRAM storage elements is stored into the SRAM storage elements, and vice versa.

Further, Since the signals DSEL* and SSEL* have the ability to function as a latch clock for a multi-address bus, the word line address and the storage array address are latched at the DSEL* falling edge; and the bit address, the storage array address and the SRAM word line address are latched at the SSEL* falling edge.

The signal R/W* determines the direction of data input and output for the external periphery of SPDRAM.

The signal MODE determines the operational mode of SPDRAM. If MODE is "0" at the DSEL* falling edge, the operation of the SRAM storage elements is stopped while the DRAM storage array operates. If MODE is "0" at the SSEL* falling edge, the input/output data for the external periphery of SPDRAM is stopped so that only the internal operation of SPDRAM is performed.

If DSEL* is "0" while the signal RFSH* is "0", the interface means 20 separates the DRAM bit lines DBL from the SRAM bit lines SBL and the refresh counter 56 generates the DRAM word line address, thereby starting the hidden refresh.

Because there exist fundamental structural differences between the SPDRAM and the DRAM, the former requires new control signals of TMODE and TSRAM. Accordingly, the clock generator 58 of SPDRAM comprises, in addition to the typical DRAM clock means, the means for generating the control signals TMODE and TSRAM.

While the signal TSRAM is active, the storage array address and the SRAM word line address are decoded; and while the signal TMODE is active, the storage array address and the most significant bit of word line address are decoded.

Since the number of the DRAM storage elements associated with a DRAM bit line is determined by the ratio of the capacitance of the DRAM storage elements to the floating capacitance of the DRAM bit line, the number of DRAM bit lines corresponding to a SRAM bit line may be several.

FIG. 3 is the detailed diagram of a portion of a storage array comprising two DRAM bit lines corresponding to one SRAM bit line in accordance with another embodiment of the present invention.

Referring to FIG. 3, the DRAM bit lines DBL111 and DBL112 are selectively connected to the SRAM bit line SBL11 by the transistors F111 and F112 of the interface means 20 so as to form a extended hierarchical bit line BL11. In a similar manner, the DRAM bit lines DBL121 and DBL122 are selectively connected to the SRAM bit line SBL12 by the transistor F121 and F122 so as to form the complementary hierarchical bit line BL12.

Also, two SRAM storage elements SS11 and SS21 are connected to the corresponding SRAM bit line SBL11 for a 2-way set associative map of cache.

The extended hierarchical bit line BL11 operates in a similar manner as does the embodiment represented by FIG. 1, except that the interface means 120 selectively connects the DRAM bit lines DBL111 and DBL112 to the SRAM bit line SBL11; and the SRAM storage elements SS11 and SS21 are selectively activated by the signals TSRAM 0 and TSRAM 1.

Figure 4:
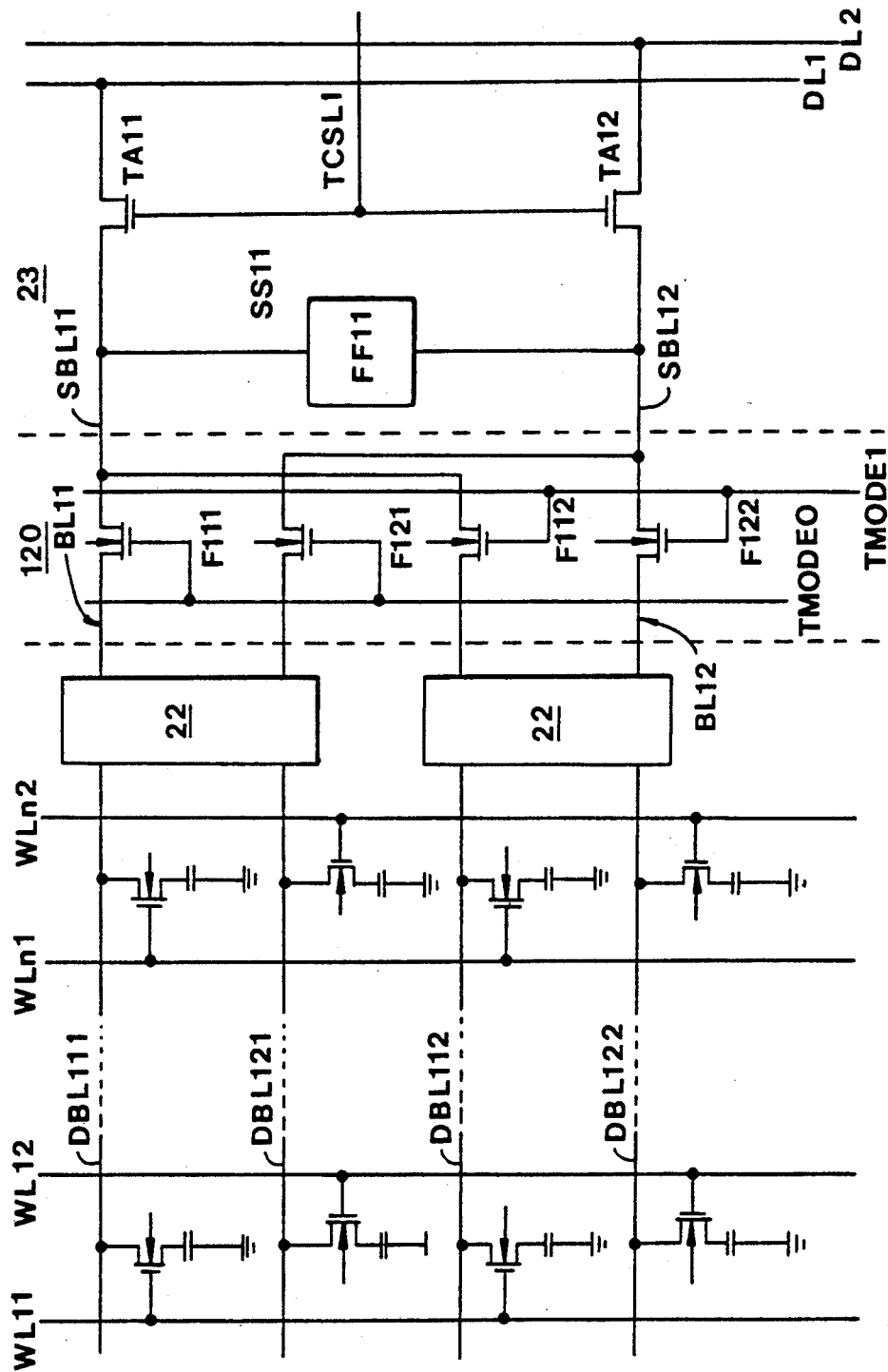
FIG. 4 is a detailed diagram of a portion of the storage array according to a further embodiment of the invention.

FIG. 4 illustrates a portion of a storage array in accordance with a further embodiment of the present invention which is generally similar to the one represented by FIG. 3 except the differences described below.

Referring now to FIG. 4, the flip flop FF11 of the SRAM storage element SS11 is directly connected to the SRAM bit line SBL11 without going through the transistor ST111 and ST112. Accordingly, the SRAM storage element SS does not need the control signal TSRAM and functions as a kind of buffer for access to the DRAM array.

A memory system can be constituted by utilizing the afore-mentioned functions of SPDRAM. For example, in a system comprising a main memory having the capacity of 4M bytes and a data bus consisting of 32 bits, it will be preferable to have 1024 bytes of line size and 32 K bytes of cache with a 2-way set associative map.

If such a memory system is constructed by utilizing the SPDRAM chips, it will require 32 SPDRAM chips with the main memory capacity of 1M*1 per chip, wherein each SPDRAM comprises 16 storage arrays and each storage array has the main memory capacity of 64K*1 bits. Further, since the word line size of the DRAM in each storage array is 256, the system memory will have the total line size of (256×32)/ 8 =1024 bytes, which is the proper line size of the cache. Since each storage array comprises two rows of SRAM storage elements, the cache size per SPDRAM chip will be (256×2)×16 =8K bits and the total cache size will be 8K×32 =32K bytes, which is the same as the preferred size mentioned above.

On the other hand, 256 storage elements are connected to each DRAM bit line, because the DRAM capacity is 64K*1 and the DRAM line size is 256, i.e., 256×256 =64K bits.

In a typical DRAM manufacturing process, since 128 storage elements are connected to a bit line, the number of DRAM bit lines becomes 512. In contrast, however, in accordance with the present invention, through the use of the interface means as shown in FIG. 3, 256 SRAM lines are in effect connected to 256 DRAM bit lines, thereby rendering it possible to maintain 256 bits of line size per each storage array.

Consequently, it will be obvious to those skilled in the art that by utilizing the SPDRAM chips as disclosed herein, it is possible to construct a cache of the optimum efficiency which does not have a limitation on the data transfer width between the main memory and the cache, and to minimize the peripheral circuitry by way of a simple SPDRAM controller.

It will be further apparent to those skilled in the art that the present embodiment utilizing a two-way associative organization can be expanded to an n-way associative cache by adding more than one SRAM storage element per each corresponding SRAM bit line; and other modifications may be made without departing from the spirit and scope of the invention disclosed herein.

What is claimed is:

1. In a semiconductor memory device comprising one or more than one storage array, each of said storage array(s) including a plurality of bit lines, and an input/output port connected to said plurality of bit lines by gate means for access to said storage array, wherein each of said bit lines comprising:
   one or more than one DRAM bit line, each of said DRAM bit line(s), including a plurality of dynamic type storage elements, each of said dynamic type storage elements having a storage capacitor means for storing data in a binary state;
   a SRAM bit line including one or more than one static type storage element, each of said static type storage element(s) having a storage flip flop means for storing data in a binary state; and
   an interface means for electrically interconnecting one of said DRAM bit line(s) to said SRAM bit line or isolating said DRAM bit line(s) from said SRAM bit line.

2. The semiconductor memory device of claim 1, wherein each of said static type storage element(s) includes gate means linking said storage flip flop means to said SRAM bit line.

3. The semiconductor memory device of claim 2, wherein each of said DRAM bit line(s) includes a sense amplifier for sensing the content of said each DRAM bit line and amplifying it to a predetermined level, and precharge means for applying a reference voltage to said DRAM bit line(s).

4. The semiconductor memory device of claim 3, wherein each of said DRAM bit line(s) includes dummy storage elements to stabilize the operation of said sense amplifier.

5. The semiconductor memory device of claim 4, wherein said storage array includes word line selection means having a plurality of word selection lines, any one of said word selection lines being connected to a group of said dynamic type storage elements in a particular row of said dynamic type storage elements associated with a particular word.

6. The semiconductor memory device of claim 5, wherein said input/output port having input/output data lines includes bit selection means having a plurality of bit selection lines, each of said bit selection lines being connected to said gate means for selectively connecting said each bit line to said input/output data lines.

7. The semiconductor memory device of claim 1, wherein said SRAM bit line includes one static type storage element and said storage flip flop means of said static type storage element(s) is directly linked to its corresponding SRAM bit line.

8. The semiconductor memory device of claim 7, wherein each of said DRAM bit line(s) includes a sense amplifier for sensing the content of said each DRAM bit line and amplifying it to a predetermined level, and precharge means for applying a reference voltage to said DRAM bit line(s).

9. The semiconductor memory device of claim 8, wherein each of said DRAM bit line(s) includes dummy storage elements to stabilize the operation of said sense amplifier.

* * * * *